United States Patent [19]
Lee

[11] Patent Number: 6,103,589
[45] Date of Patent: Aug. 15, 2000

[54] HIGH-VOLTAGE DEVICE SUBSTRATE STRUCTURE AND METHOD OF FABRICATION

[75] Inventor: Jia-Sheng Lee, Hsinchu, Taiwan

[73] Assignee: United Microelectronics Corp., Hsinchu, Taiwan

[21] Appl. No.: 09/104,087

[22] Filed: Jun. 24, 1998

[30] Foreign Application Priority Data

Apr. 23, 1998 [TW] Taiwan .................................. 87106240

[51] Int. Cl.$^7$ .................................................. H01L 21/76
[52] U.S. Cl. ........................ 438/400; 438/238; 438/268; 438/307; 438/529
[58] Field of Search ................................. 438/400, 238, 438/307, 529, 268

[56] References Cited

U.S. PATENT DOCUMENTS

| | | | |
|---|---|---|---|
| 5,589,695 | 12/1996 | Malhi | 257/77 |
| 5,734,180 | 3/1998 | Malhi | 257/77 |
| 5,966,608 | 10/1999 | Gong et al. | 438/307 |

*Primary Examiner*—Richard Elms
*Assistant Examiner*—Pho Luu
*Attorney, Agent, or Firm*—Thomas, Kayden, Horstemeyer & Risley

[57] ABSTRACT

A method for fabricating a high-voltage device substrate comprising the steps of forming a pad oxide layer and a mask layer over a substrate. Then, the pad oxide layer and the mask layer are patterned to define a region for a first ion implantation. Next, the exposed substrate is oxidized to form a field oxide layer. Thereafter, the mask layer is removed followed by a first ion implantation. Next, the field oxide layer is completely removed. Subsequently, a photoresist layer is formed over the first ion implanted region. This is followed by a second ion implantation. Then, a conformal oxide layer is formed covering the substrate surface. Next, a high temperature drive-in and oxidation operation is carried out, in which ions in the first ion implanted region and the second ion implanted region are driven deeper into the substrate interior, and at the same time the substrate above those regions are oxidized. Finally, the oxide layer on the substrate surface is removed, and then an epitaxial layer is formed over the substrate.

23 Claims, 5 Drawing Sheets

HIGH-VOLTAGE DEVICE SUBSTRATE STRUCTURE AND METHOD OF FABRICATION

CROSS-REFERENCE TO RELATED APPLICATION

This application claims the priority benefit of Taiwan application serial no. 87106240, filed Apr. 23, 1998, the full disclosure of which is incorporated herein by reference.

BACKGROUND OF THE INVENTION

1. Field of Invention

The present invention relates to a method for fabricating a semiconductor device substrate. More particularly, the present invention relates to a method for fabricating a high-voltage device substrate capable of preventing junction breakdown and leakage current in the source/drain regions of a MOS transistor.

2. Description of Related Art

In general, most high-voltage MOS devices thicken an isolating layer between the gate and the source/drain regions as a means of lowering the horizontal electric field within the channel. Alternatively, the drift regions below the isolation layer and the graded regions beneath the source/drain regions are lightly doped to provide the necessary voltage gradient. The two above measures are capable of increasing junction breakdown voltage in the source/drain regions so that the MOS transistor is able to operate normally despite the application of a high voltage.

As the level of integration for semiconductor devices continues to increase, rules for forming high-voltage devices become more stringent. Besides having to increase the degree of integration, the distance of separation between two neighboring devices has to be carefully planned. The most commonly used method for preparing a MOS device for high voltages is to increase distance between neighboring devices and/or adding one more lightly doped layer to provide the necessary voltage gradient. Therefore, before a high-voltage device is formed, the substrate has to undergo a number of processing treatments to enhance its voltage bearing capacity. However, the difference in the height between substrate surfaces in different doped regions for a conventionally processed high-voltage MOS device substrate is small. Hence, when an epitaxial layer is grown onto the substrate, the alignment of masks in subsequent processing operations is difficult.

The progression of manufacturing steps in the process of fabricating a conventional high-voltage device substrate is illustrated in FIGS. 1A through 1K, to provide a better understanding of the process First, as shown in FIG. 1A, a substrate 100 such as a P-type substrate is provided. Then, a pad oxide layer 102 is formed over the substrate 100 using a thermal oxidation method. Thereafter, a chemical vapor deposition (CVD) method is used to form a silicon nitride layer 104 over the pad oxide layer 102.

Next, as shown in FIG. 1B, using photolithographic and etching techniques, the silicon nitride layer 104 and the pad oxide layer 102 are patterned to form a stacked layer 106. The stack layer 106 is composed of a silicon nitride layer 104a and a pad oxide layer 102a.

Next, as shown in FIG. 1C, a field oxide (FOX) layer 112 is formed between two neighboring stack layers 106 through a thermal oxidation such as a wet oxidation.

Next, as shown in FIG. 1D, the silicon nitride layer 104a is removed using a wet etching method, for example.

Subsequently, an ion implantation is carried out to form a heavily doped P$^+$ region 108 in the substrate underneath the pad oxide layer 102a. For example, the implantation can be carried out using boron (B$^{11}$) ions with an implantation energy level of about 70 KeV and a dosage level of about $2.0 \times 10^{15}$/cm$^2$.

Next, as shown in FIG. 1E, the pad oxide layer 102a and the field oxide layer 112 are removed to expose the entire substrate surface 100. Thereafter, an atmospheric pressure chemical vapor deposition (APCVD) method is used to deposit an oxide layer 122 over the substrate 100. Preferably, the oxide layer 122 is formed using tetra-ethyl-ortho-silicate (TEOS) as a gaseous reactant in the APCVD process. Since a TEOS oxide layer requires densification, the oxide layer 122 also needs to be densified. For example, densification is carried out using a temperature of about 1000° C. for about 10 to 30 minutes. After the densification operation, the oxide layer 122 will contract a little, making it somewhat denser.

Next, as shown in FIG. 1F, a patterned photoresist layer 110 is formed over the oxide layer 122. Subsequently, the oxide layer 122 is anisotropically etched using the photoresist layer 110 as a mask. Hence, an oxide layer 122a is formed and at the same time exposes the substrate region 100 so that ions of polarity opposite to the ions already in the doped region 108 are ready to be implanted.

Next, as shown in FIG. 1G, another ion implantation is carried out, implanting ions having polarity opposite to those of the heavily doped P$^+$ region 108. In other words, N-type ions are implanted into the substrate 100 to form a heavily doped N$^+$ region 118. For example, the implantation can be carried out using arsenic (As$^{75}$) ions with an implantation energy level of about 100 KeV and a dosage level of about $4.0 \times 10^{14}$/cm$^2$.

Next, as shown in FIG. 1H, the photoresist layer 110 is removed. Then, an APCVD method is used to deposit another oxide layer 132 over the substrate 100, covering the heavily doped N+ region 118 and the oxide layer 122a. Preferably, the oxide layer 132 having a thickness of about 3000 Å is deposited using TEOS as the gaseous reactant in an APCVD process.

Next, as shown in FIG. 1I, oxidation and dopant drive-in operations are carried out simultaneously. The silicon substrate 100 is placed inside a reaction chamber having some moisture in the atmosphere, and then heated to initiate thermal oxidation. The heat also drives the previously implanted ions in the doped regions deeper into the substrate. Since the heavily doped N$^+$ region 118a is only covered by a very thin layer of oxide 132 above, silicon within the heavily doped N$^+$ region 118a is able to oxidize into silicon dioxide. Consequently, an oxide layer 142 is formed between the silicon substrate 100 and the oxide layer 132, where the oxide layer 142 also includes the former oxide layer 122a as well.

Next, as shown in FIG. 1J, the oxide layer above the silicon substrate 100 is completely removed. Both oxide layers 132 and 142 are removed to expose the entire silicon substrate surface 100.

Finally, as shown in FIG. 1K, an epitaxial layer 150 is formed over the substrate surface 100 so that the fabrication of a silicon substrate suitable for forming high-voltage devices is complete. The epitaxial layer 150 can be formed using, for example, a chemical vapor deposition (CVD) method. The epitaxial layer 150 preferably having a thickness of about 19 μm can be turned into an N-type epitaxial layer if doping of N-type ions is also carried out during the CVD operation.

In the aforementioned fabrication process for a high-voltage device substrate, the difference in height level between the highest (in the P-doped region 108a) and lowest point (in the N-doped region 118a) on the substrate surface is small. Therefore, when the epitaxial layer 150 is formed over the substrate 100, the peak and the trough of the epitaxial layer will also be quite small. Consequently, when alignment marks are subsequently formed on the surface for alignment of photomasks in the fabrication of high-voltage devices, alignment will be inaccurate. This can lead to processing errors and an increase in product failure.

In light of the foregoing, there is a need to provide an improved method of fabricating high-voltage device substrate.

SUMMARY OF THE INVENTION

Accordingly, the present invention provides a method for fabricating a high-voltage device substrate that has a greater difference in topographical level between substrate surfaces in the heavily doped $N^+$ region and the heavily doped $P^+$ region, through which subsequent alignment of photomasks is more accurate and processing time is reduced.

To achieve these and other advantages and in accordance with the purpose of the invention, as embodied and broadly described herein, the invention provides a method for fabricating a high-voltage device substrate. The method comprises the steps of forming a pad oxide layer and a mask layer over a substrate. Then, the pad oxide layer and the mask layer are patterned to define a region for a first ion implantation. Next, the exposed substrate is oxidized to form a field oxide layer. Thereafter, the mask layer is removed followed by a first ion implantation. Next, the field oxide layer is completely removed. Subsequently, a photoresist layer is formed over the first ion implanted region. This is followed by a second ion implantation. Then, a conformal oxide layer is formed covering the substrate surface. Next, a high temperature drive-in and oxidation operation is carried out. This serves to drive the ions implanted into the first ion implanted region and the ions implanted into the second implanted region deeper into the substrate interior, and at the same time oxidizes the substrate surface of those regions. Finally, the oxide layer on the substrate surface is removed, and then an epitaxial layer is formed over the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 2A through 2J are cross-sectional views showing the progression of manufacturing steps in fabricating a high-voltage device substrate according to one preferred embodiment of this invention.

DESCRIPTION OF THE PREFERRED EMBODIMENTS

Figure 1A:
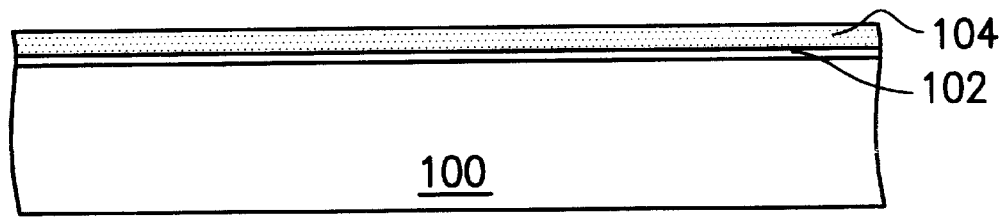
FIGS. 1A through 1K are cross-sectional views showing the progression of manufacturing steps in fabricating a conventional high-voltage device substrate.
Figure 1B:
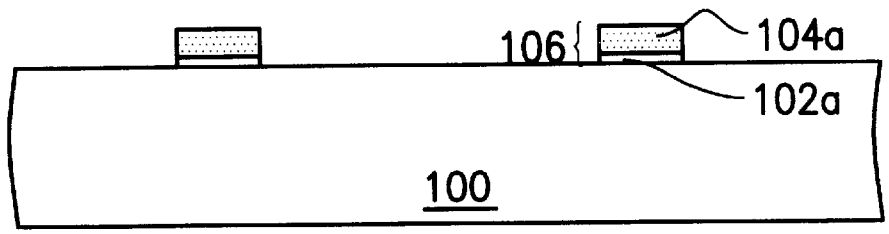
Figure 1C:
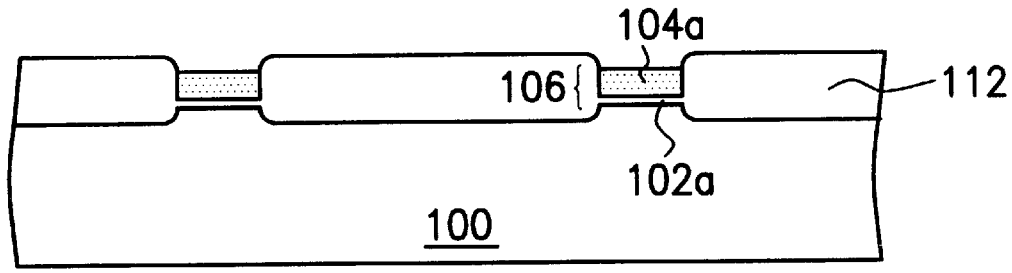
Figure 1D:
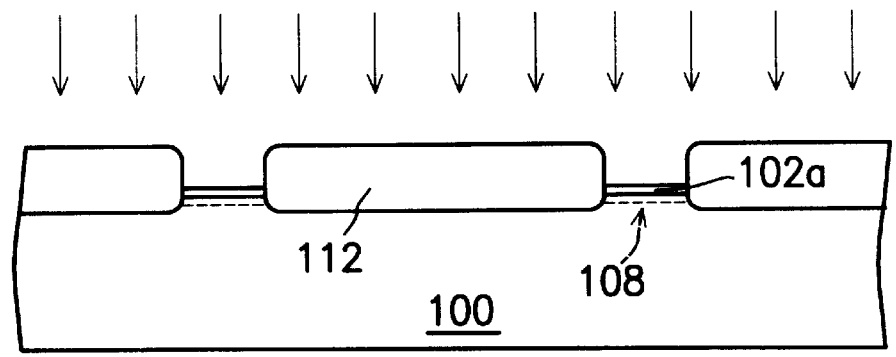
Figure 1E:
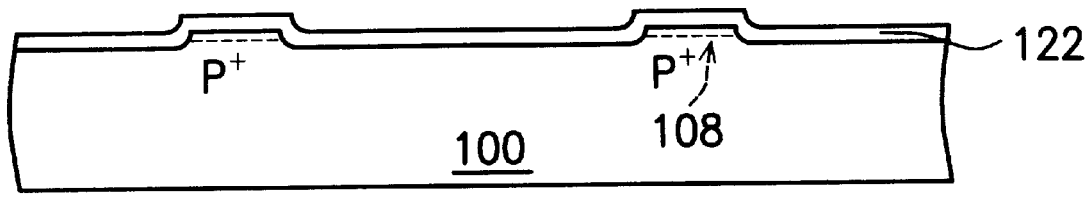
Figure 1F:
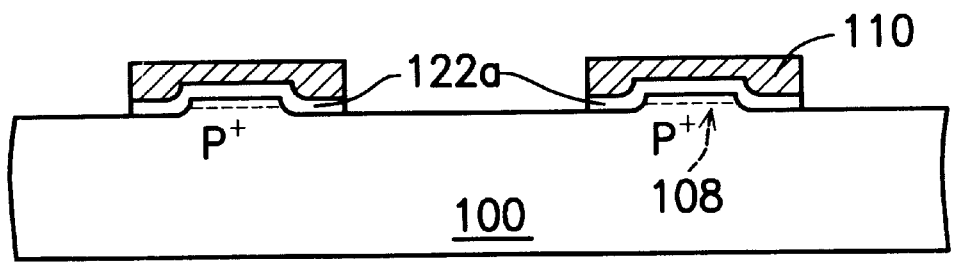
Figure 1G:
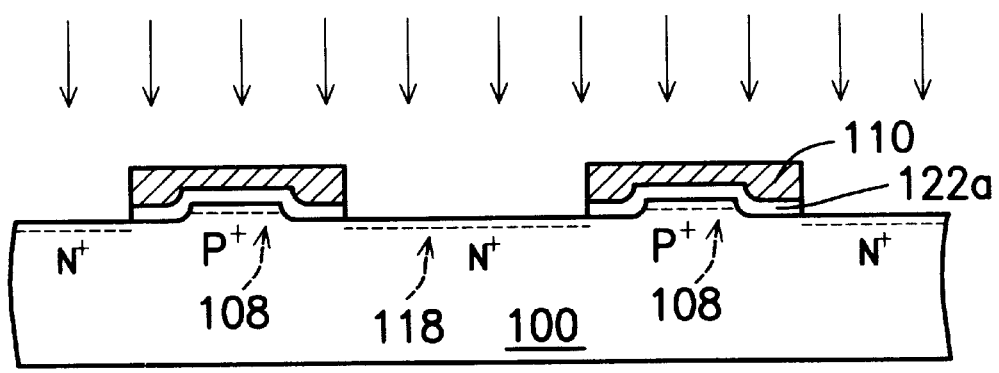
Figure 1H:
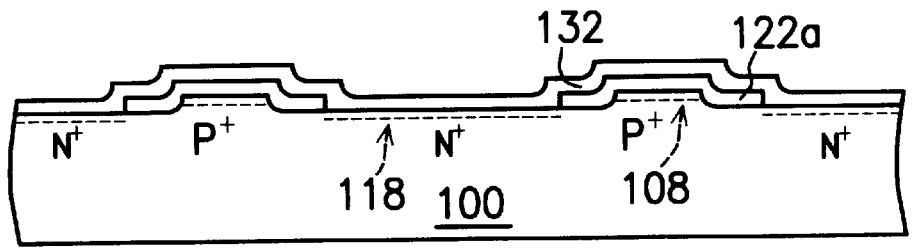
Figure 1I:
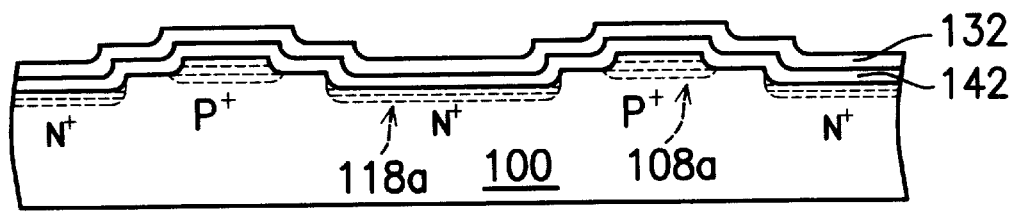
Figure 1J:
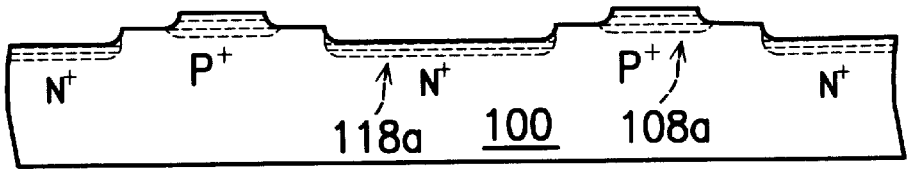
Figure 1K:
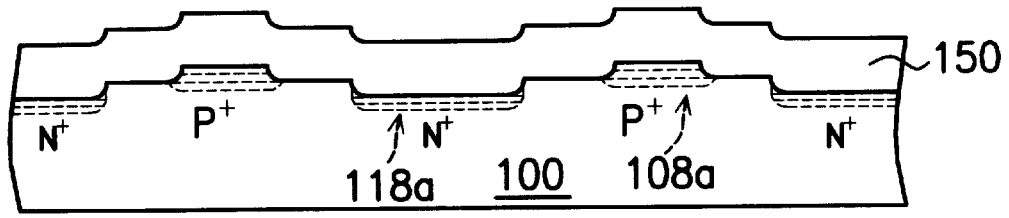

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2J are cross-sectional views showing the progression of manufacturing steps in fabricating a high-voltage device substrate according to one preferred embodiment of this invention.

Figure 2A:
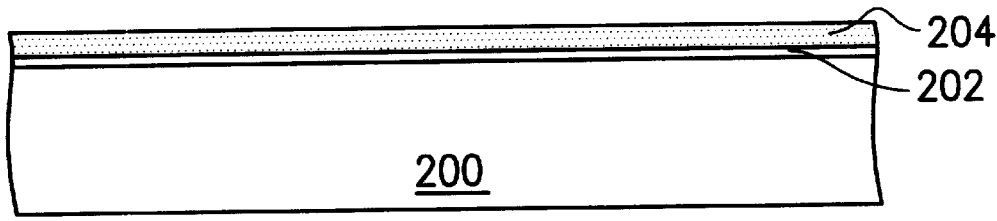

First, as shown in FIG. 2A, a pad oxide layer 202 having a thickness of about 400 Å is formed over a substrate 200, such as a P-type silicon substrate, using a thermal oxidation method. Then, a chemical vapor deposition (CVD) method is used to form a mask layer 204 over the pad oxide layer 202. The mask layer 204 having a thickness of about 1500 Å can be a silicon nitride layer 204.

Figure 2B:
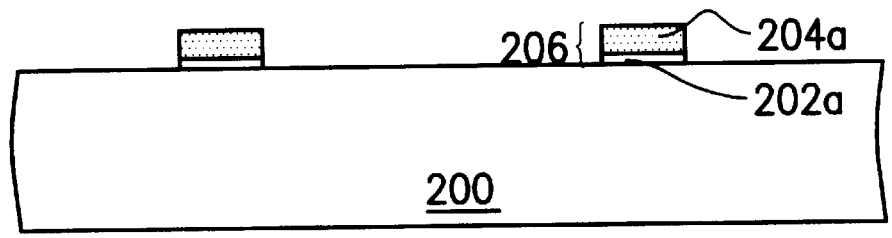

Next, in FIG. 2B, photolithographic and etching methods are used to pattern the silicon nitride layer 204 and the pad oxide layer 202. Consequently, stack layers 206, each composed of a silicon nitride layer 204a and a pad oxide layer 202a, are formed.

Figure 2C:
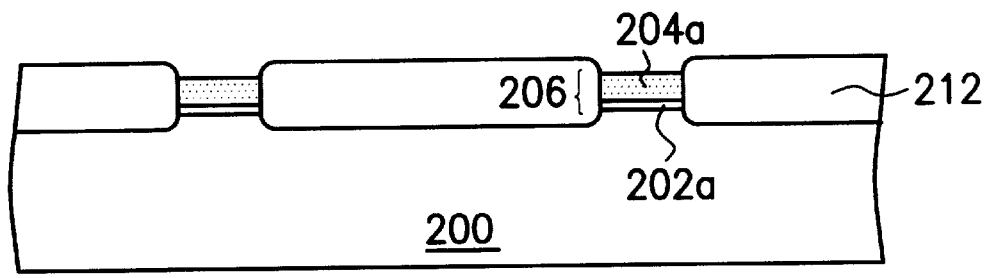

Next, in FIG. 2C, a thermal oxidation, for example, a wet oxidation is carried out to form a field oxide layer 212 having a thickness of about 11000 Å between two neighboring stack layers 206.

Figure 2D:
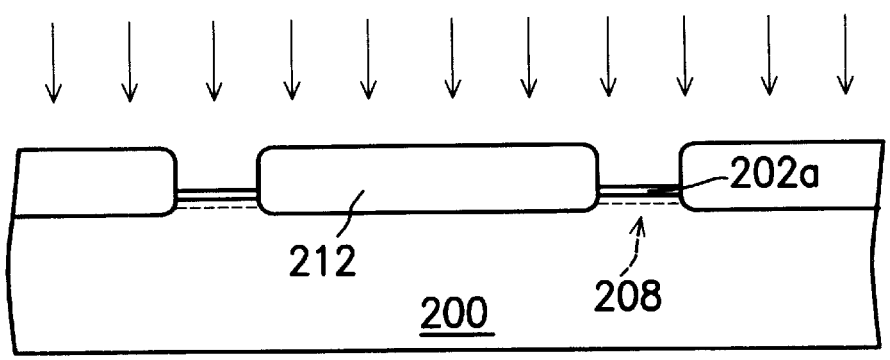

Next, in FIG. 2D, the silicon nitride layer 204a is removed using, for example, a wet etching method. Subsequently, an ion implantation is conducted to form a heavily doped $P^+$ region 208 in the substrate underneath the pad oxide layer 202a. For example, the implantation can be carried out using boron ($B^{11}$) ions with an implantation energy level of about 70 KeV and a dosage level of about $2.0 \times 10^{15}/cm^2$.

Figure 2E:
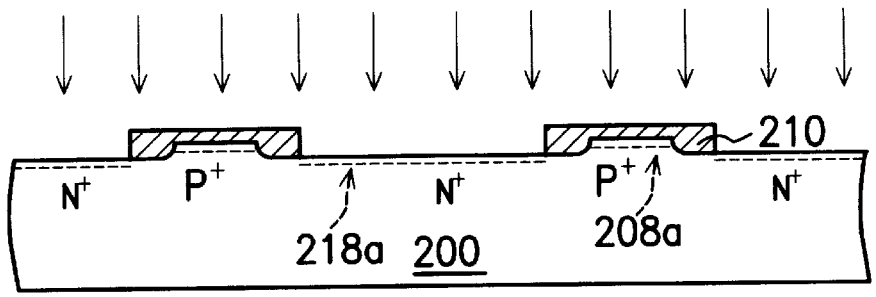

Next, as shown in FIG. 2E, the field oxide layer 212 is removed, and then a patterned photoresist layer 210 is formed over the substrate 200. Thereafter, using the photoresist layer 210 as a mask, another ion implantation is carried out implanting ions having polarity opposite to the heavily doped $P^+$ region 208. In other words, N-type ions are implanted into the substrate 200 to form a heavily doped $N^+$ region 218. For example, the implantation can be carried out using arsenic ($As^{75}$) ions with an implantation energy level of about 100 KeV and a dosage level of about $4.0 \times 10^{14} 1/cm^2$.

Figure 2F:
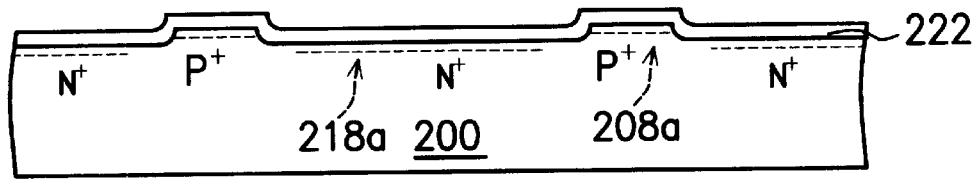

Subsequently, as shown in FIG. 2F, the photoresist layer 210 is removed. Then, a conformal oxide layer 222 is deposited over the substrate 200 using an atmospheric pressure chemical vapor deposition (APCVD) method. The conformal oxide layer 222 preferably having a thickness of about 3000 Å is formed using tetra-ethyl-ortho-silicate (TEOS) as a gaseous reactant in APCVD operation.

Figure 2G:
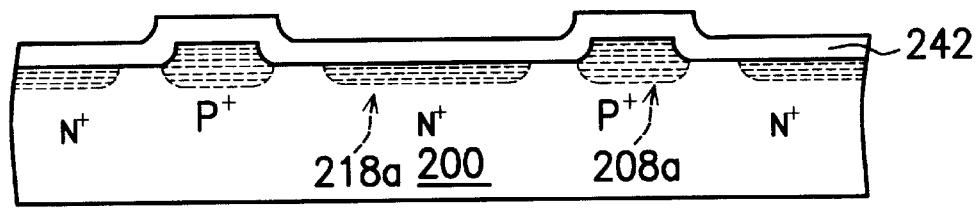

Next, as shown in FIG. 2G, oxidation and dopant drive-in operations are carried out simultaneously. The silicon substrate 200 is placed inside a reaction chamber having some moisture in the atmosphere so that a portion of the silicon substrate 200 is oxidized. In the meantime, the heat generated by the oxidation also drives the N+ and P+ ions in the respective ion implanted regions deeper into the substrate 200.

Since the whole substrate 200 is covered by a rather thin oxide layer 222, the substrate surface is able to oxidize in the presence of moisture at a high temperature. Hence, the newly oxidized layer is able to combine with the original oxide layer 222 to form a thicker oxide layer 242.

Besides forming an oxide layer in the top surface of the heavily doped $N^+$ region 218a next to the substrate surface, an oxide layer is similarly formed on the top surface of the heavily doped $P^+$ region 208a next to the substrate surface.

Therefore, the difference in height between the high points (the heavily doped P+ region 208a) and the low points (the heavily doped N+ region 218a) on the substrate surface is greater than the one produced by a conventional method. Consequently, the subsequently formed epitaxial layer will also have a difference in height greater than the one formed by a conventional means. When alignment marks for aligning photomasks are subsequently formed over the epitaxial layer, alignment accuracy will be greatly increased. Moreover, the heavily doped P+ region can serve as an alignment mark, which can be more easily aligned than using the heavily doped N+ region as in a conventional process.

Figure 2I:
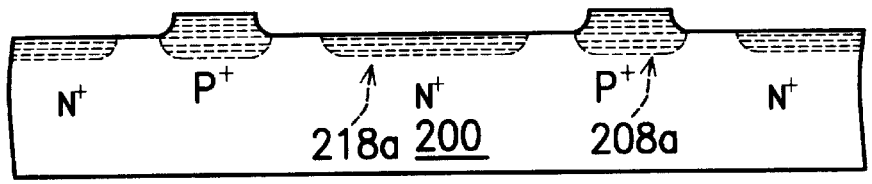

Next, as shown in FIG. 2I, the oxide layer 242 above the silicon substrate 200 is removed to expose the entire substrate surface.

Figure 2J:
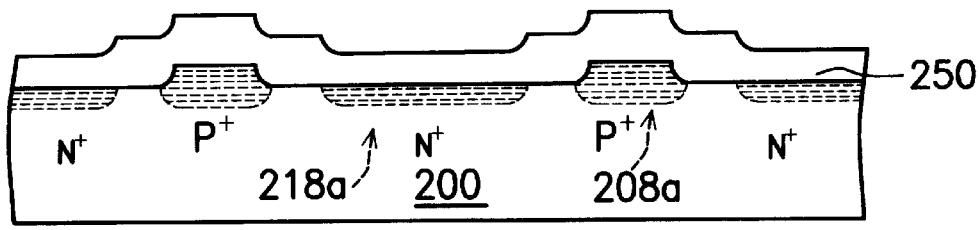

Finally, as shown in FIG. 2J, an epitaxial layer 250 is formed over the substrate surface 200 so that the fabrication of a silicon substrate suitable for forming high-voltage devices is complete. The epitaxial layer 250 can be formed using, for example, a chemical vapor deposition (CVD) method. The epitaxial layer 250 preferably having a thickness of about 19 μm can be turned into an N-type epitaxial layer if doping of N-type ions is also carried out during the CVD operation.

In summary, the method of forming the high-voltage device substrate in this invention includes the following advantages:

(1) The conventional processing method needs an additional oxide layer formed by an APCVD process. Furthermore, this APCVD oxide layer needs to carry out subsequent densification and etching procedure. Therefore, this invention is able to save up to one or two days of processing time. Moreover, the densification of the APCVD oxide layer is difficult to control, and scraps resulting from abnormal formation are high. In other words, conventional processing method needs a higher cost and a longer time.

(2) The subsequently formed epitaxial layer over the substrate also has a difference in height level greater than the one formed by a conventional method. When alignment marks for aligning photomasks are subsequently formed on the epitaxial layer, alignment accuracy will be greatly increased. Moreover, the heavily doped P− region can serve as an alignment mark, which can be more easily aligned than using the heavily doped N+ region in a conventional process.

(3) The processing steps used in this invention are compatible with the existing fabricating procedures. Therefore, the method can be immediately run in a factory production line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating high-voltage device substrate, comprising the steps of:

sequentially forming a pad oxide layer and a mask layer over a substrate;

patterning the mask layer and the pad oxide layer to expose a first region in the substrate where oxidation is to be formed later;

performing a thermal oxidation whereby the first region is oxidized into a first oxide layer;

removing the mask layer and then performing a first ion implantation, thus forming a first ion doped region in the substrate underneath the pad oxide layer;

removing the first oxide layer so that the first region previously covered by the first oxide layer is exposed;

forming a patterned photoresist layer over the substrate to cover the first ion doped region, whereby a portion of the first region is still exposed;

performing a second ion implantation to form a second ion doped region in the substrate at the exposed portion of the first region, wherein the second ion doped region is not overlapping with the first ion doped region;

removing the patterned photoresist layer and then forming a conformal second oxide layer over the substrate;

performing a thermal drive-in, which also induces oxidation reaction between the conformal second oxide layer and the substrate, whereby a conformal third oxide layer is formed over the substrate and is thicker than the conformal second oxide layer;

removing the conformal third oxide layer that covers the substrate surface; and forming an epitaxial layer over the substrate.

2. The method of claim 1, wherein the step of forming the pad oxide layer includes a thermal oxidation method.

3. The method of claim 1, wherein the pad oxide layer has a thickness of about 400 Å.

4. The method of claim 1, wherein the step of forming the mask layer includes a chemical vapor deposition method.

5. The method of claim 1, wherein the mask layer has a thickness of about 1500 Å.

6. The method of claim 1, wherein the step of performing thermal oxidation includes a wet oxidation method.

7. The method of claim 1, wherein the first oxide layer has a thickness of about 11000 Å.

8. The method of claim 1, wherein the step of removing the mask layer includes a wet etching method.

9. The method of claim 1, wherein the step of performing the first implantation includes implanting boron ($B^{11}$) ions with an implantation energy level of about 70 KeV and a dosage level of about $2.0 \times 10^{15}/cm^2$.

10. The method of claim 1, wherein the step of performing the second implantation includes implanting arsenic ($As^{75}$) ions with an implantation energy level of about 100 KeV and a dosage level of about $4.0 \times 10^{14}/cm^2$.

11. The method of claim 1, wherein the ions used in the first ion implantation is of the opposite polarity to the ions used in the second ion implantation.

12. The method of claim 1, wherein the step of forming the second oxide layer includes an atmospheric pressure chemical vapor deposition method.

13. The method of claim 1, wherein the second oxide layer has a thickness of about 3000 Å.

14. The method of claim 1, wherein the step of performing high temperature drive in and oxidation reaction is for forming a third oxide layer over the first ion doped region and the second ion doped region, and at the same time driving the ions in the first ion doped region and the second ion doped region deeper into the substrate interior.

15. The method of claim 14, wherein the third oxide layer is formed on the first ion doped substrate region and on the second ion doped substrate region after performing the high temperature drive-in and oxidation reaction.

16. The method of claim 1, wherein the step of forming an epitaxial layer over the substrate further includes implanting ions of the same polarity type as the second ion doped region.

17. The method of claim 1, wherein the epitaxial layer has a thickness of about 19 μm.

18. A high-voltage device substrate structure, comprising:

a substrate;

a first ion doped region, wherein the first ion doped region is located on the protruded portion of the substrate surface, and the first ion doped region can serve as an alignment mark for photomask in subsequent processing of high-voltage devices;

a second ion doped region, wherein the second ion doped region is located on the recess portion of the substrate surface; and an epitaxial layer located on the substrate surface.

19. The structure of claim 18, wherein the first ion doped region is formed by implanting boron ($B^{11}$) ions with an implantation energy level of about 70 KeV and a dosage level of about $2.0\times10^{15}/cm^2$.

20. The structure of claim 18, wherein the second ion doped region is formed by implanting arsenic ($As^{75}$) ions with an implantation energy level of about 100 KeV and a dosage level of about $4.0\times10^{14}/cm^2$.

21. The structure of claim 18, wherein the ions in the first ion doped region is of the opposite polarity type to the ions in the second ion doped region.

22. The structure of claim 18, wherein the epitaxial layer further contains some doped ions having the same polarity type as the second ion doped region.

23. The structure of claim 18, wherein the epitaxial layer has a thickness of about 19 μm.

* * * * *